United States Patent
Kubota et al.

(10) Patent No.: US 10,386,407 B2
(45) Date of Patent: Aug. 20, 2019

(54) SOCKET

(71) Applicant: SHINKO ELECTRIC INDUSTRIES CO., LTD., Nagano (JP)

(72) Inventors: Kazuyuki Kubota, Nagano (JP); Tomoki Kobayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/120,611

(22) Filed: Sep. 4, 2018

(65) Prior Publication Data
US 2019/0120895 A1  Apr. 25, 2019

(30) Foreign Application Priority Data
Oct. 23, 2017  (JP) .................. 2017-204693

(51) Int. Cl.
| | | |
|---|---|---|
| H05K 1/16 | (2006.01) | |
| G01R 31/28 | (2006.01) | |
| H05K 1/18 | (2006.01) | |
| H05K 1/11 | (2006.01) | |
| H05K 1/14 | (2006.01) | |
| H01R 12/71 | (2011.01) | |

(Continued)

(52) U.S. Cl.
CPC ....... *G01R 31/2808* (2013.01); *G01R 1/0408* (2013.01); *H01L 25/00* (2013.01); *H01R 12/714* (2013.01); *H01R 13/24* (2013.01); *H01R 13/639* (2013.01); *H01R 33/74* (2013.01); *H01R 33/97* (2013.01); *H05K 1/11* (2013.01); *H05K 1/144* (2013.01); *H05K 1/18* (2013.01); *H01R 2201/20* (2013.01); *H05K 2201/042* (2013.01); *H05K 2201/10515* (2013.01)

(58) Field of Classification Search
CPC .................. H01R 12/57; H01R 13/235; H05K 2201/0311; H05K 2201/10378; H05K 2201/10719; H05K 2201/10946; H05K 3/325; H05K 3/3421
USPC .......... 174/260–262, 351; 361/760, 772, 778
See application file for complete search history.

(56) References Cited

U.S. PATENT DOCUMENTS 3,844,576 A * 10/1974 Schultes ................ A63C 5/075
                                                                  280/610
7,388,742 B2 * 6/2008 Cargin, Jr. ............ G06F 1/1613
                                                                  361/679.01

(Continued)

FOREIGN PATENT DOCUMENTS

JP  2011-123015  6/2011

*Primary Examiner* — Phuong Chi T Nguyen
(74) *Attorney, Agent, or Firm* — IPUSA, PLLC

(57) ABSTRACT

A socket has a main body that accommodates a PCBA (Printed Circuit Board Assembly) to be inspected. The PCBA includes a substrate mounted with an electronic component, and terminals protruding from the substrate and having side surfaces exposed at an outer peripheral surface of the substrate, and the terminals are positioned within a cavity or opening of the main body in a state in which the PCBA is accommodated in the cavity or opening. The socket further has probes respectively including a fixed part fixed to the main body, and a movable part movable with respect to the fixed part, and a pressing part to press against the movable part of the probe. The movable part includes a tip end part that moves to a position contactable to the side surface of one terminal within the cavity or opening, when the pressing part presses against the movable part.

10 Claims, 7 Drawing Sheets

(51) Int. Cl.
    *H01R 33/74*     (2006.01)
    *H01R 13/639*     (2006.01)
    *H01R 33/97*     (2006.01)
    *G01R 1/04*     (2006.01)
    *H01R 13/24*     (2006.01)
    *H01L 25/00*     (2006.01)

(56) References Cited

U.S. PATENT DOCUMENTS

| | | | | |
|---|---|---|---|---|
| 7,405,948 B2 * | 7/2008 | Sato | ............... | H01R 13/2414 |
| | | | | 361/752 |
| 8,735,737 B2 * | 5/2014 | Ihara | ............... | H01R 12/57 |
| | | | | 174/261 |
| 8,836,509 B2 * | 9/2014 | Lowy | ............... | G06F 21/86 |
| | | | | 257/678 |

\* cited by examiner

SOCKET

CROSS-REFERENCE TO RELATED APPLICATION

This application is based upon and claims the benefit of priority of the prior Japanese Patent Application No. 2017-204693, filed on Oct. 23, 2017, the entire contents of which are incorporated herein by reference.

FIELD

Certain aspects of the embodiments discussed herein are related to a socket.

BACKGROUND

A socket is used when inspecting a PCBA (Printed Circuit Board Assembly) mounted with electronic components, and this socket has inspection probes that make electrical connections to the PCBA. For example, it is possible to use a socket that is capable of contacting the probes to connection terminals provided on a lower surface of the PCBA, from under the lower surface of the PCBA, as proposed in Japanese Laid-Open Patent Publication No. 2011-123015, for example.

However, in a case in which the PCBA has a structure such that the probes cannot contact the connection terminals provided on the lower surface of the PCBA, from under the lower surface of the PCBA, a special structure for enabling inspection needs to be provided on the PCBA. For example, the special structure for enabling inspection may be an inspection pattern that is provided on the lower surface of the PCBA and contactable by the probes upon inspection, or an inspection pattern that is provided in an extended region of the PCBA extended in a horizontal direction of the PCBA and contactable by the probes upon inspection. But the special structure for enabling inspection increases a size of the PCBA, increases a cost of the PCBA, or increases both the size and the cost of the PCBA.

SUMMARY

Accordingly, it is an object in one aspect of the embodiments to provide a socket that enables inspection of a PCBA without providing a special structure for enabling inspection, even in a case in which the PCBA has a structure such that probes cannot contact connection terminals provided on a lower surface of the PCBA, from under the lower surface of the PCBA.

According to one aspect of the embodiments, a socket includes a main body including one of a cavity and an opening configured to accommodate a printed circuit board assembly that is to be inspected, wherein the printed circuit board assembly includes a substrate mounted with an electronic component, and a plurality of connection terminals protruding from a surface of the substrate and respectively having a side surface exposed at an outer peripheral surface of the substrate, and wherein the plurality of connection terminals are positioned within the one of the cavity and the opening in a state in which the printed circuit board assembly is accommodated in the one of the cavity and the opening; plurality of probes respectively including a fixed part that is fixed to the main body, and a movable part that is movable with respect to the fixed part; and a pressing part configured to press against the movable part, wherein the movable part includes a tip end part that moves to a position contactable to the side surface of one of the plurality of connection terminals within the one of the cavity and the opening, when the pressing part presses against the movable part.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
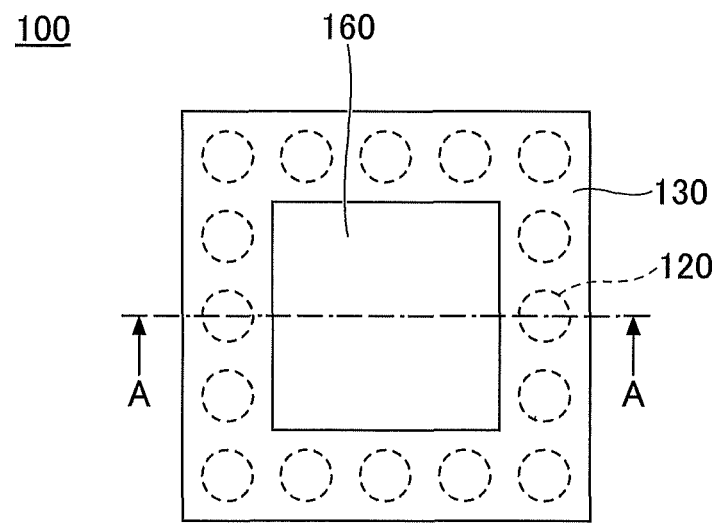
FIG. 1A and FIG. 1B are diagrams illustrating an example of a PCBA to be inspected.

Preferred embodiments of the present invention will be described with reference to the accompanying drawings. In the drawings, those parts that are the same are designated by the same reference numerals, and a repeated description of the same parts may be omitted.

A description will now be given of the socket in each embodiment according to the present invention.

First Embodiment

[Inspection Target]

Figure 1B:
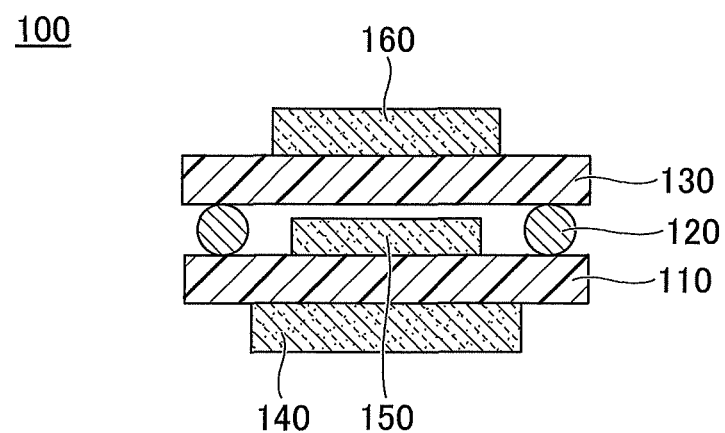

First, a description will be given of a PCBA (Printed Circuit Board Assembly) that is mounted with electronic components, and is an inspection target to be inspected by a socket 10 which will be described later. FIG. 1A and FIG. 1B are diagrams illustrating an example of the PCBA to be inspected. FIG. 1A is a plan view of the PCBA, and FIG. 1B is a cross sectional view of the PCBA along a line A-A in FIG. 1A.

As illustrated in FIG. 1A and FIG. 1B, a PCBA 100 has a structure in which a substrate 110 and a substrate 130 are stacked via connection terminals 120 that electrically connect the substrate 110 and the substrate 130. An electronic component 140 is mounted on a lower surface of the substrate 110, and an electronic component 150 is mounted on an upper surface of the substrate 110. An electronic component 160 is mounted on an upper surface of the substrate 130. In addition, an electronic component (not illustrated) may be mounted on a lower surface of the substrate 130.

Each of the substrates 110 and 130 is a so-called glass epoxy substrate made of a resin-impregnated glass cloth that is impregnated with an insulator resin, such as an epoxy resin or the like, for example. Each of the substrates 110 and 130 may be a build-up substrate, a silicon substrate, a ceramic substrate, or the like. The electronic components 140, 150, and 160 may be semiconductor devices, resistors, capacitors, or the like, for example.

The connection terminals 120 have functions to electrically connect the substrate 110 and the substrate 130, and to secure a predetermined gap (or distance) between the substrate 110 and the substrate 130. In the plan view illustrated in FIG. 1A, the connection terminals 120 are arranged in peripheral parts of the substrates 110 and 130, for example. Conductive side surfaces of the connection terminals 120 are exposed at outer peripheral sides of the substrates 110 and 130, and are contactable by probes from sides of the PCBA 100. Each connection terminal 120 may be a solder ball with a core (for example, a copper core ball or the like), for example. Each connection terminal 120 may be a solder ball without a core. In addition, each connection terminal 120 may be a metal post (for example, a copper post or the like).

In the example illustrated in FIG. 1A and FIG. 1B, the PCBA 100 has a so-called POP (Package-On-Package) structure. However, the inspection target to be inspected is not limited to the PCBA having the so-called POP structure. The inspection target to be inspected may be a PCBA at least including connection terminals protruding from substrates mounted with electronic parts, such that side surfaces of the connection terminals are exposed at outer peripheral sides of the substrates. The inspection target to be inspected, such as the PCBA having the so-called POP structure, and the PCBA at least including the connection terminals protruding from the substrates as described above, may be inspected by the socket 10 which will be described later.

[Socket]

Figure 2:
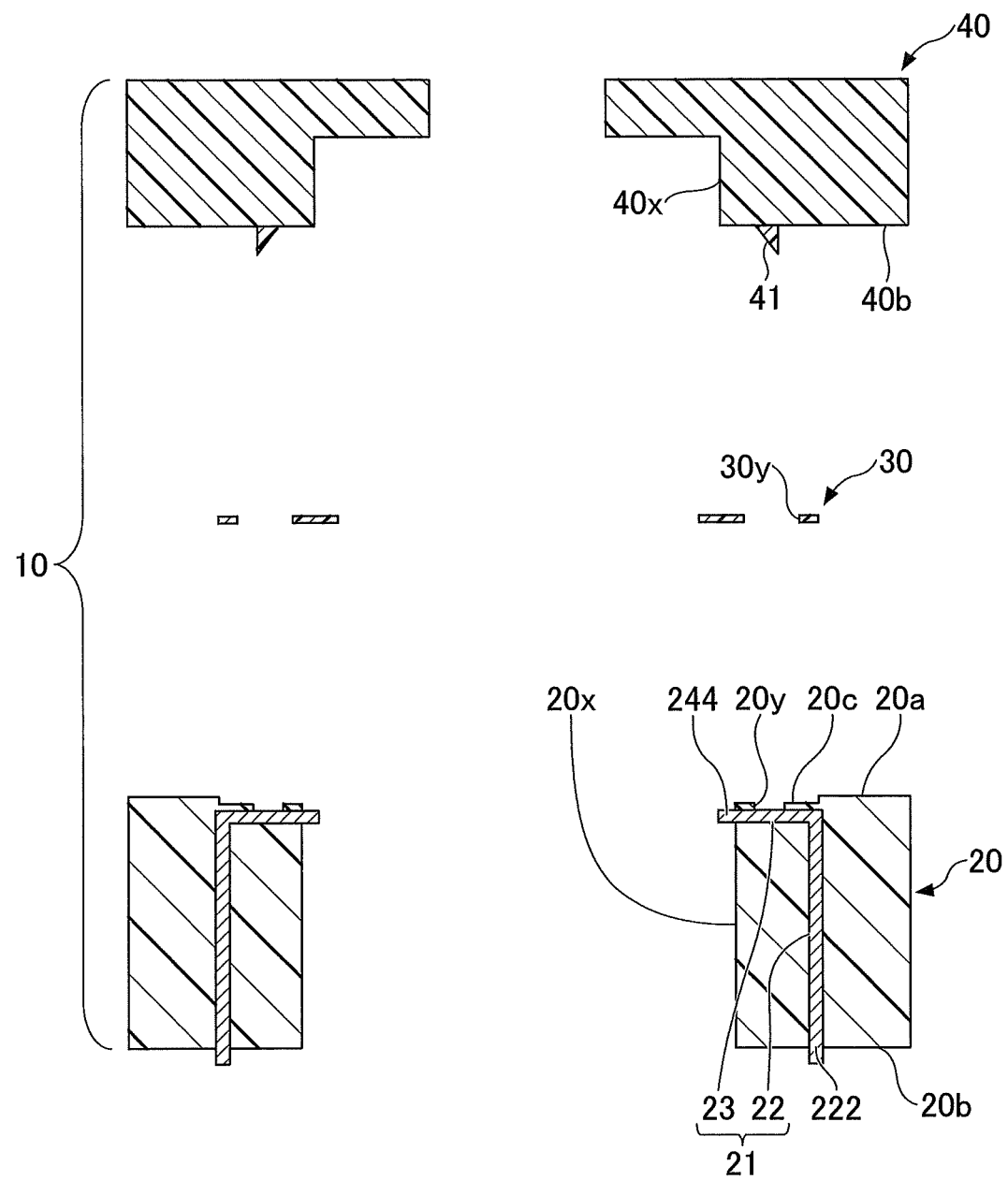
FIG. 2 is a cross sectional view illustrating an example of a socket in a first embodiment.

Next, the socket used to inspect the PCBA will be described. FIG. 2 is a cross sectional view illustrating an example of the socket in a first embodiment. As illustrated in FIG. 2, the socket 10 includes a main body 20, a holding member 30, and a lid part 40, as constituent elements thereof.

Figure 3A:
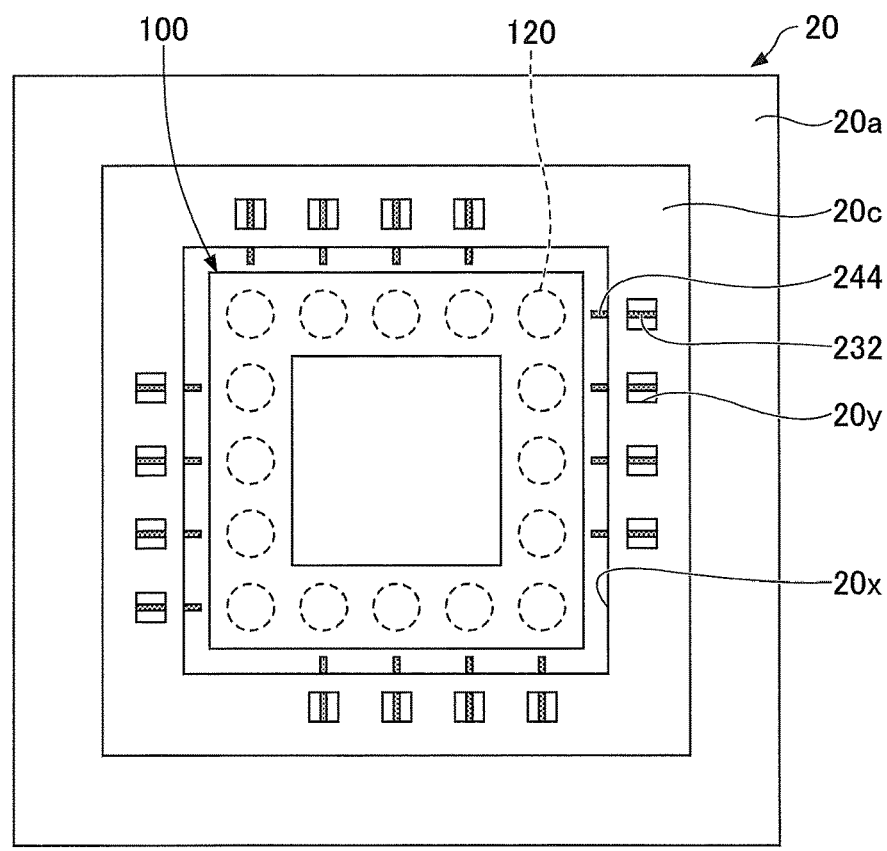
FIG. 3A and FIG. 3B are plan views illustrating an example of a main body of the socket in the first embodiment.
Figure 3B:
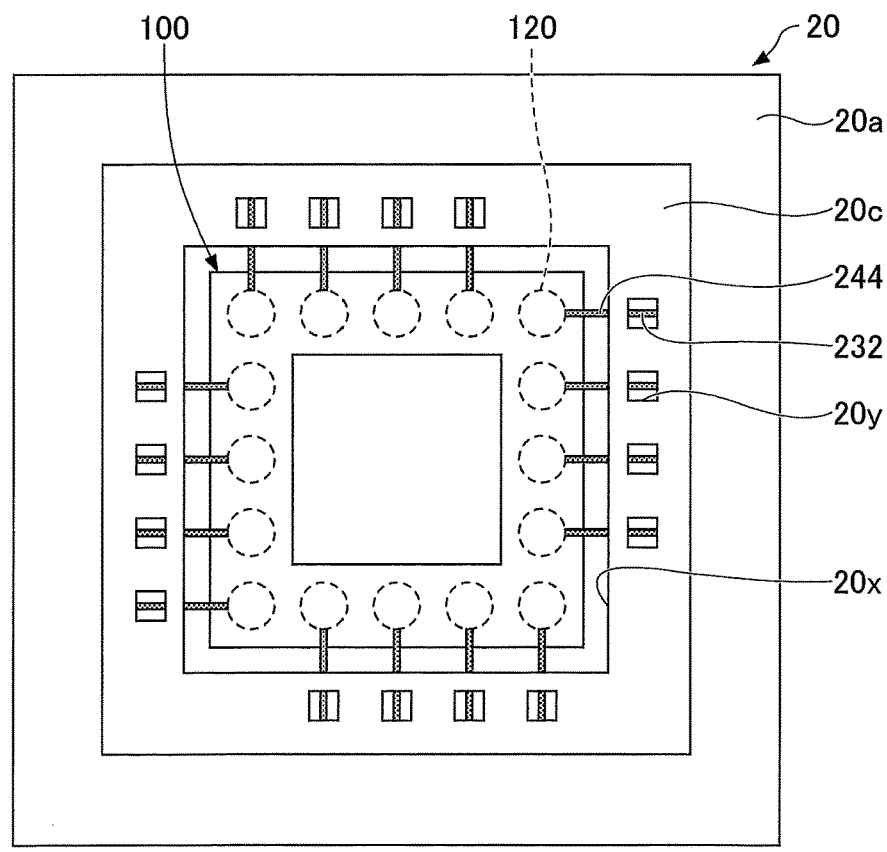

Next, each of the constituent elements of the socket 10 will be described, by referring to FIG. 3A through FIG. 5B. FIG. 3A and FIG. 3B are plan views illustrating an example of the main body of the socket in the first embodiment. FIG. 3A illustrates the main body 20 in an initial state in which probes 21 are not extended, and FIG. 3B illustrates the main body 20 in a state in which the probes 21 are extended. In FIG. 3A and FIG. 3B, a position where the PCBA 100 is arranged is illustrated for the sake of convenience, however, the PCBA 100 is not a constituent element of the main body 20.

Figure 4A:
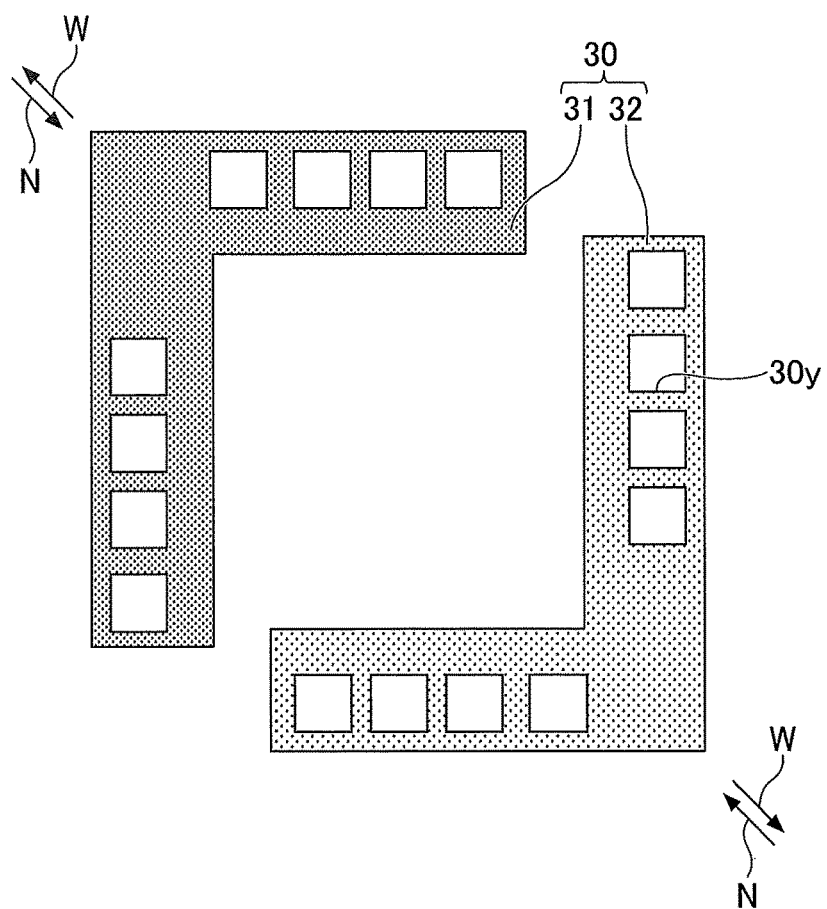
FIG. 4A and FIG. 4B are plan views illustrating an example of a holding member of the socket in the first embodiment.
Figure 4B:
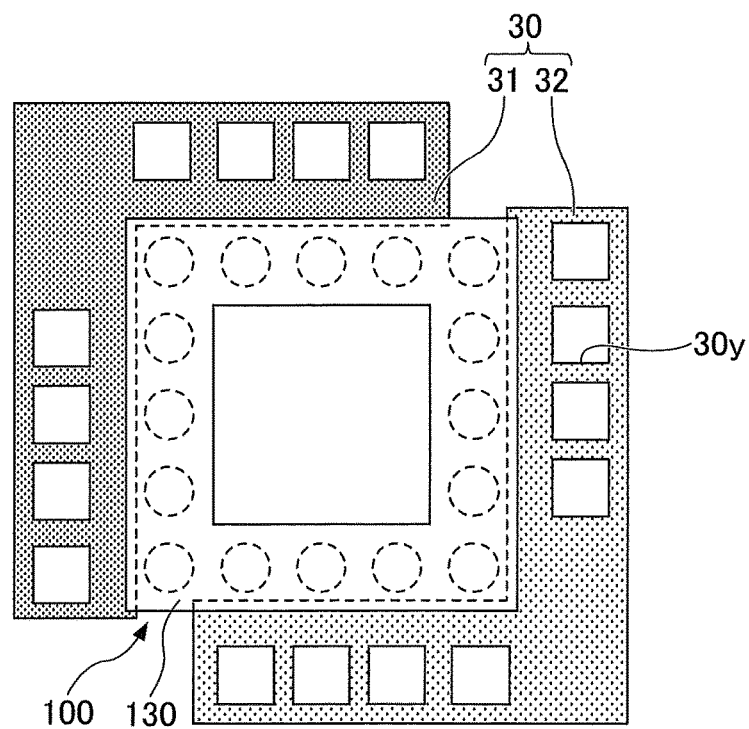
Figure 5A:
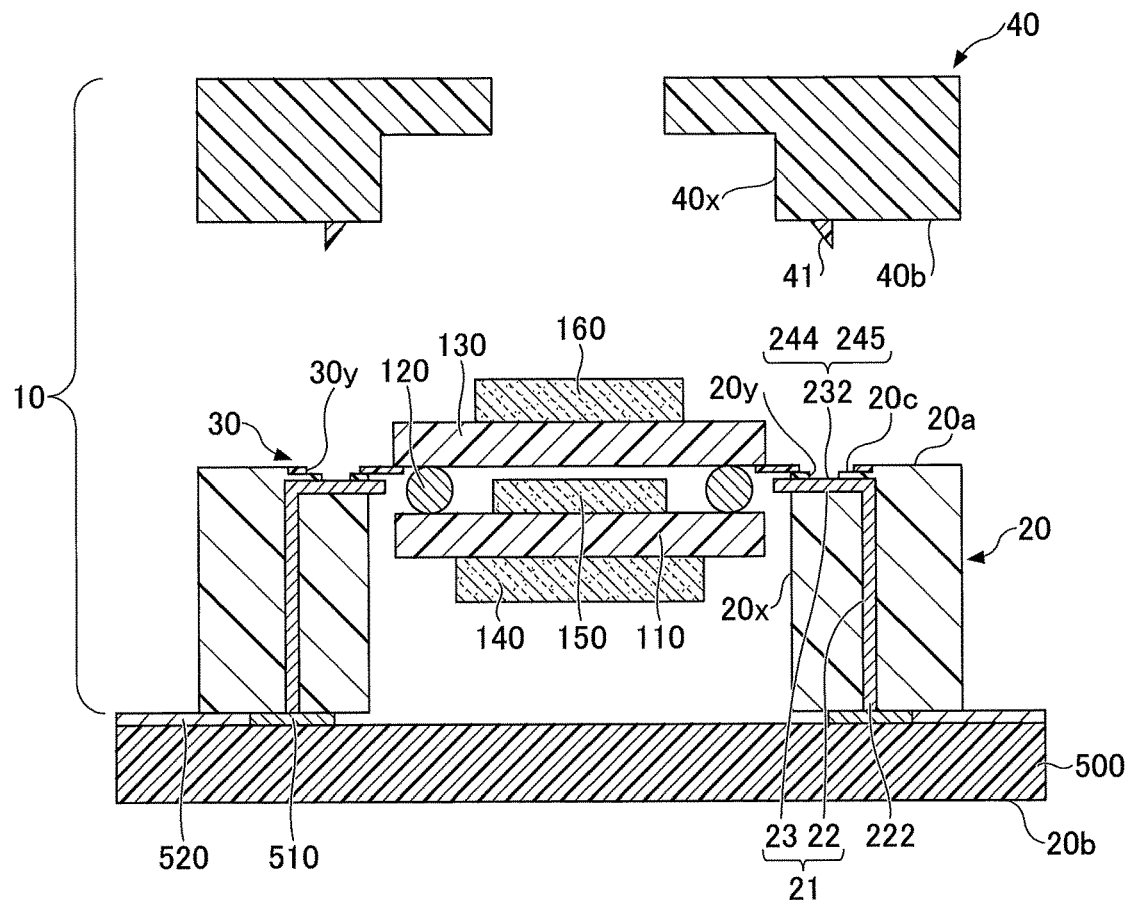
FIG. 5A and FIG. 5B are diagrams illustrating an example of a state in which the PCBA is accommodated in the socket in the first embodiment.
Figure 5B:
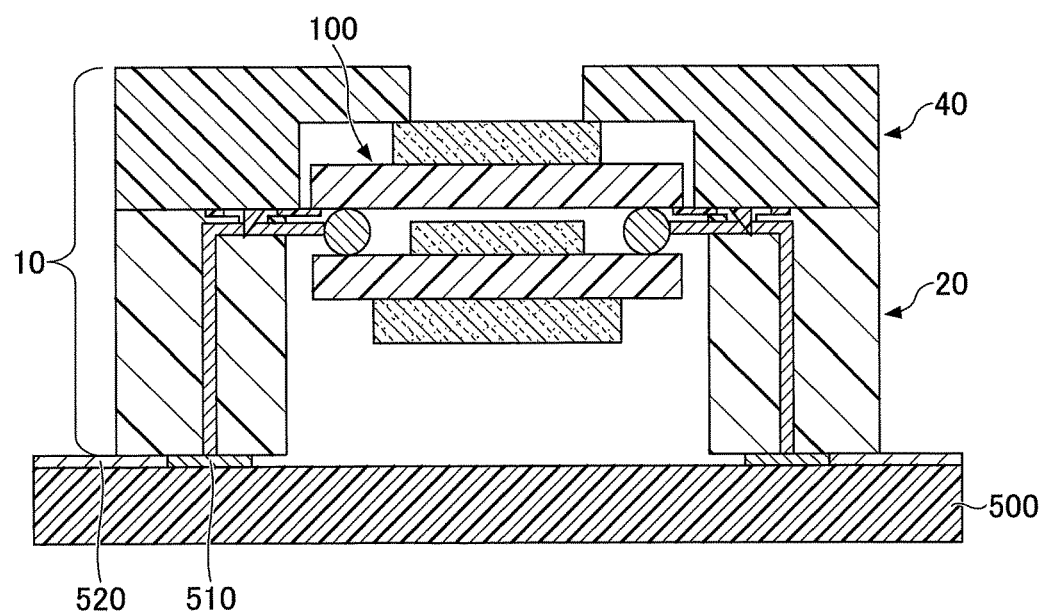

FIG. 4A and FIG. 4B are plan views illustrating an example of the holding member of the socket in the first embodiment. FIG. 4A illustrates an initial state in which the holding member 30 does not hold the PCBA 100, and FIG. 4B illustrates a state in which the holding member 30 holds the PCBA 100. FIG. 5A and FIG. 5B are diagrams illustrating an example of a state in which the PCBA is accommodated in the socket in the first embodiment. FIG. 5A illustrates a state before the lid part 40 is arranged on the main body 20, and FIG. 5B illustrates a state after the lid part 40 is arranged on the main body 20.

As illustrated in FIG. 5A and FIG. 5B, the PCBA 100 is accommodated between the main body 20 and the lid part 40, in a state in which the PCBA 100 is held by the holding member 30. The main body 20 accommodates the PCBA 100 within an opening 20x so that at least the connection terminals 120 are positioned within the opening 20x. The opening 20x is an example of an accommodating part of the main body 20 accommodating the PCBA 100. In FIG. 5A and FIG. 5B, the main body 20 is fixed to an inspection board 500 by screws. Pads 510, and wirings 520 electrically connected to the pads 51, are provided on the inspection board 500. In addition, an inspection circuit (not illustrated) or the like, that inspects the PCBA 100 and outputs a judgment result related to the inspection, is electrically connected to the wirings 520.

The main body 20, the holding member 30, and the lid part 40 may be made of an insulator resin, such as an epoxy resin or the like, for example. The main body 20, the holding member 30, and the lid part 40 may be made of a metal, for example, and an insulator layer may be provided at required parts on the metal surface.

As illustrated in FIG. 2, FIG. 3A, and FIG. 3B, the main body 20 is a tubular member having the opening 20x at a central part thereof. The main body 20 includes probes 21 respectively having a movable part that moves in a horizontal direction to a position contactable to (that is, a position capable of making contact to) the side surface of the connection terminal 120 of the PCBA 100. The number of probes 21 that are provided is equal to the number of connection terminals 120 to which the probes 21 are required to make contact when inspecting the PCBA 100. The main body 20 may be a box-shaped member having a cavity (or recess) in place of the opening 20x.

The probe 21 may have an L-shape formed by a vertical part 22 that is fixed to the main body 20, and a horizontal part 23 having a first part that is fixed to the main body 20 and a second part that is movable toward the PCBA 100. A tip end part 222 of the vertical part 22 of each of the probes 21 has a columnar shape (or cylindrical shape), for example, and projects from a lower surface 20b of the main body 20. The tip end part 222 is electrically connectable to an electrode pad of the inspection board 500 that is arranged below the main body 20. A tip end part 244 of the horizontal part 23 of each of the probes 21 has a columnar shape (or cylindrical shape), for example, and is exposed within the opening 20x so as to oppose the side surface of one of the connection terminals 120 of the PCBA 100.

A stepped part 20c, that is one step lower than an upper surface 20a of the main body 20, is provided in the upper surface 20a at the opening 20x. The stepped part 20c positions the holding member 30 with respect to the main body 20 when the holding member 30 is arranged on the main body 20. The stepped part 20c includes openings 20y. The opening 20y exposes an upper surface of the probe 21, and the opening 20y is provided for each of the probes 21.

As illustrated in FIG. 2, FIG. 4A, and FIG. 4B, the holding member 30 holds the PCBA 100, and the holding member 30 is positioned with respect to the main body 20. In addition, the holding member 30 includes two L-shaped members 31 and 32. The L-shaped members 31 and 32 are configured to move back and forth in directions of arrows W and N in FIG. 4A. As illustrated in FIG. 4B, FIG. 5A, and FIG. 5B, inner edge parts of the L-shaped members 31 and 32 contact outer edge parts of the lower surface of the substrate 130, to hold the PCBA 100 on the holding member 30.

When holding the PCBA 100 on the holding member 30, the L-shaped members 31 and 32 are moved in the directions of the arrows W to separate from each other, and the L-shaped members 31 and 32 are thereafter moved in the directions of the arrows N to close upon each other so as to sandwich the PCBA 100 from both sides.

Each of the L-shaped members 31 and 32 includes openings 30y. The openings 30y are arranged at positions overlapping the openings 20y of the main body 20 when the holding member 30 is arranged on the stepped part 20c of the main body 20.

The lid part 40 is a tubular member having an opening 40x at a central part thereof. When performing measurements on the PCBA 100 that is held by the holding member 30, the lid part 40 is arranged on the main body 20 to fix the PCBA 100 on the main body 20. A plurality of pressing parts 41 project from a lower surface 40b of the lid part 40, in a direction toward the main body 20. The lid part 40 may be a box-shaped member having a cavity (or recess) in place of the opening 40x.

When the lid part 40 is arranged on the main body 20, the pressing parts 41 of the lid part 40 enter the respective openings 30y and the respective openings 20y. Hence, as illustrated in FIG. 3B and FIG. 5B, the tip end part 244 of each probe 21 moves toward the PCBA 100, and contacts the side surface of the connection terminal 120 that is arranged at the corresponding position. As a result, the connection terminals 120 of the PCBA 100 electrically connect to the electrode pads of the inspection board 500 that is arranged below the main body 20.

The lid part 40 may be provided with a lock mechanism (not illustrated). This lock mechanism is locked to lock the lid part 40 onto the main body 20 in a state in which the PCBA 100 is accommodated between the main body 20 and the lid part 40. This lock mechanism is unlocked to permit removal of the lid part 40 from the main body 20, so that the PCBA 100 can be removed outside the socket 10.

Figure 6A:
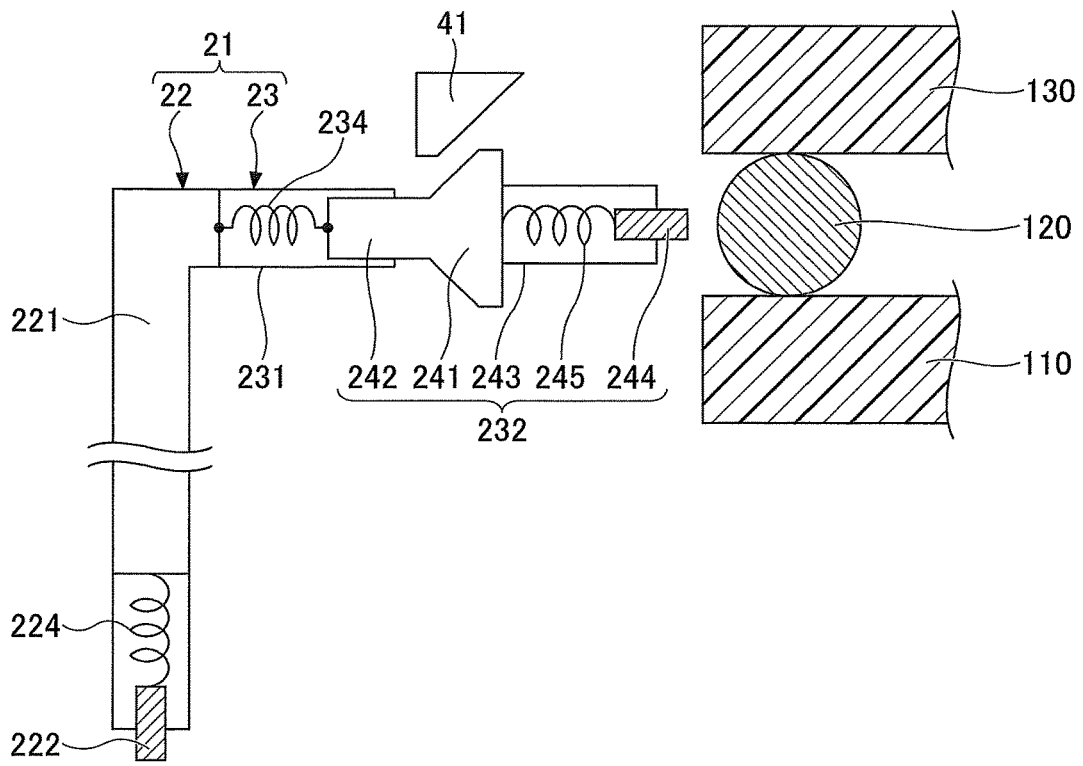
FIG. 6A and FIG. 6B are diagrams for explaining a probe of the socket in the first embodiment.
Figure 6B:
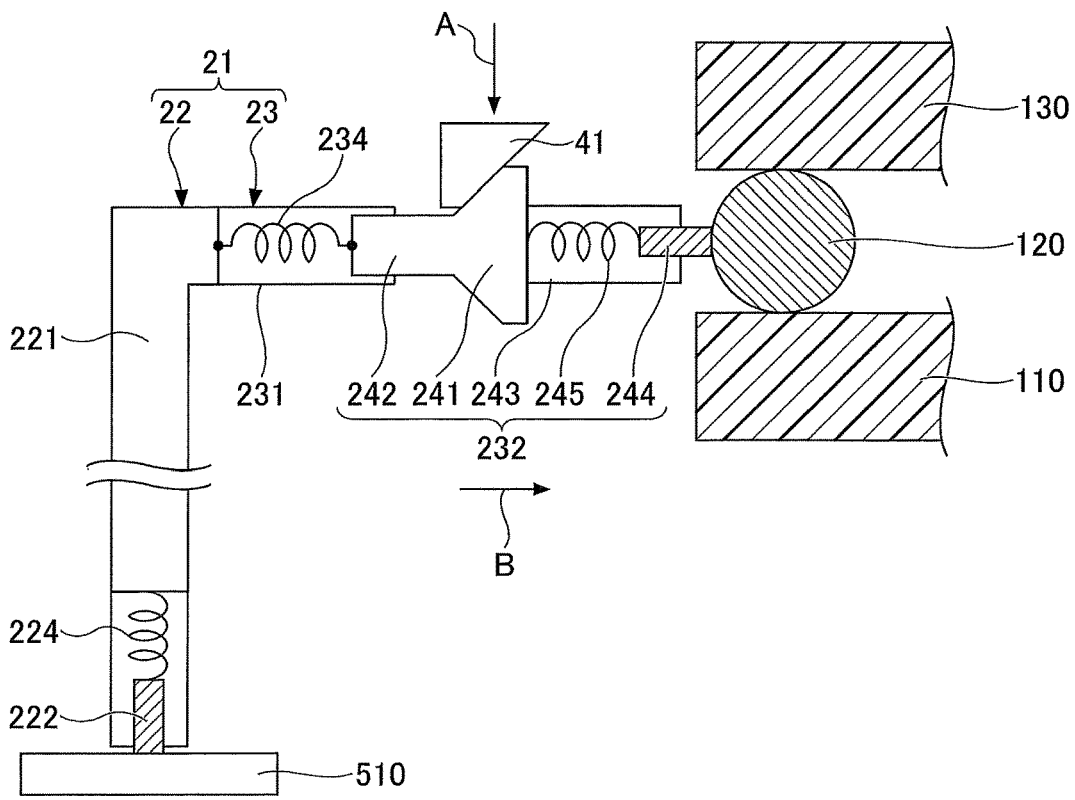

Next, the probe 21 will be described in more detail, by referring to FIG. 6A and FIG. 6B. FIG. 6A and FIG. 6B are diagrams for explaining the probe of the socket in the first embodiment. FIG. 6A illustrates a state in which the tip end part of the probe does not contact a target to be contacted, and FIG. 6B illustrates a state in which the tip end part of the probe contacts the target to be contacted.

As illustrated in FIG. 6A and FIG. 6B, the vertical part 22 of the probe 21 includes a columnar part 221 and a tip end part 222. The columnar part 221 has a cylindrical shape, for example, and is an example of a fixed part (of the vertical part 22) that is fixed to the main body 20. The tip end part 222 is an example of a movable part (of the vertical part 22) that is movable with respect to the fixed part. One end of the tip end part 222 enters inside the columnar part 221 from a lower end of the columnar part 221, and a coil spring 224 is arranged between the one end of the tip end part 222 and one end of the columnar part 221. The other end of the tip end part 222 projects from the lower end of the columnar part 221. When the main body 20 is arranged on the inspection board 500, the coil spring 224 is compressed and the tip end part 222 is urged toward the inspection board 500. Hence, as illustrated in FIG. 6B, the other end of the tip end part 222 contacts a pad 510 provided on the inspection board 500 and is electrically connected to the pad 510.

The horizontal part 23 of the probe 21 includes a tubular part 231 and a movable part 232. The tubular part 231 has a hollow cylindrical shape, for example, and is an example of a fixed part (of the horizontal part 23) that is fixed to the main body 20. The movable part 232 is an example of a movable part (of the horizontal part 23) that is movable with respect to the fixed part (of the horizontal part 23). The movable part 232 includes a tapered part 241, a tubular part 242, a tubular part 243, the tip end part 244, and a coil spring 245. The tapered part 241 has a diameter that increases from the tubular part 231 toward the opening 20x (that is, toward the PCBA 100). The tubular part 242 has a hollow cylindrical shape, for example, and is connected to a small-diameter part of the tapered part 241. The tubular part 243 has a hollow cylindrical shape, for example, and is connected to a large-diameter part of the tapered part 241. One end of the tip end part 244 enters inside the tubular part 243 from an inner side (that is, the side of the opening 20x) along the horizontal direction of the tubular part 243. The coil spring 245 is arranged between the one end of the tip end part 244 and the large-diameter part of the tapered part 241.

One end of the tubular part 242 enters inside the tubular part 231 from an inner side (that is, the side of the opening 20x) along the horizontal direction of the tubular part 231. A coil spring 234 is arranged between the one end of the tubular part 242 and the other end of the columnar part 221.

The coil springs 224, 234, and 245 are examples of an urging means (or urging member). The urging means (or urging member) is not limited to the coil spring, and may include a leaf spring, a rubber member, or the like.

When a transition is made from the state illustrated in FIG. 5A to the state illustrated in FIG. 5B and the lid part 40 is arranged on the main body 20, a sloping part of the pressing part 41 presses the tapered part 241 in a direction of an arrow A, as illustrated in FIG. 6B. Hence, the compressed coil spring 234 expands, to move the movable part 232 in a direction of an arrow B (that is, in the direction toward the opening 20x). In addition, the other end of the tip end part 244 of the movable part 232 contacts the side surface of the connection terminal 120 within the opening 20x.

When the movable part 232 moves further in the direction of the arrow B (that is, in the direction toward the opening 20x), the coil spring 245 is compressed in the state in which the other end of the tip end part 244 contacts the side surface of the connection terminal 120. Accordingly, the tip end part 244 is urged toward the connection terminal 120, and the other end of the tip end part 244 contacts the connection terminal 120 and is electrically connected to the connection terminal 120. By compressing the coil spring 245, it is possible to prevent damage to the side surface of the connection terminal 120.

The probe 21 of the socket 10 may have any structure capable of moving the movable part 232 back and forth in the horizontal direction, parallel to the upper surface of the substrate 110 from which the connection terminals 120 protrude or parallel to the lower surface of the substrate 130 from which the connection terminals 120 protrude, according to a pressing force. Further, the probe 21 of the socket 10 is not limited to the structure in which the sloping part of the pressing part 41 presses against the tapered part 241.

Accordingly, the socket 10 is provided with the probe 21 having the movable part 232 that can move back and forth in the horizontal direction according to the pressing force of the pressing part 41. For this reason, even in a case in which probes cannot contact the connection terminals 120 from under the lower surface of the PCBA 100, the probes 21 can contact the side surfaces of the connection terminals 120. As a result, it is possible to inspect the PCBA 100 without providing a special structure for enabling inspection of the PCBA 100.

For example, the special structure for enabling inspection may be an inspection pattern that is provided on the lower surface of the PCBA and contactable by the probes upon inspection, or an inspection pattern that is provided in an extended region of the PCBA extended in a horizontal direction of the PCBA and contactable by the probes upon inspection. But the special structure for enabling inspection is undesirable in that the special structure increases a size of the PCBA, increases a cost of the PCBA, or increases both the size and the cost of the PCBA. The increase in the cost of the PCBA may be caused by a need to cut and remove the extended region of the PCBA after the inspection of the PCBA.

Second Embodiment

In a second embodiment, no holding member is provided. In this second embodiment, those parts that are the same as those corresponding parts of the first embodiment are designated by the same reference numerals, and a description thereof may be omitted.

Figure 7A:
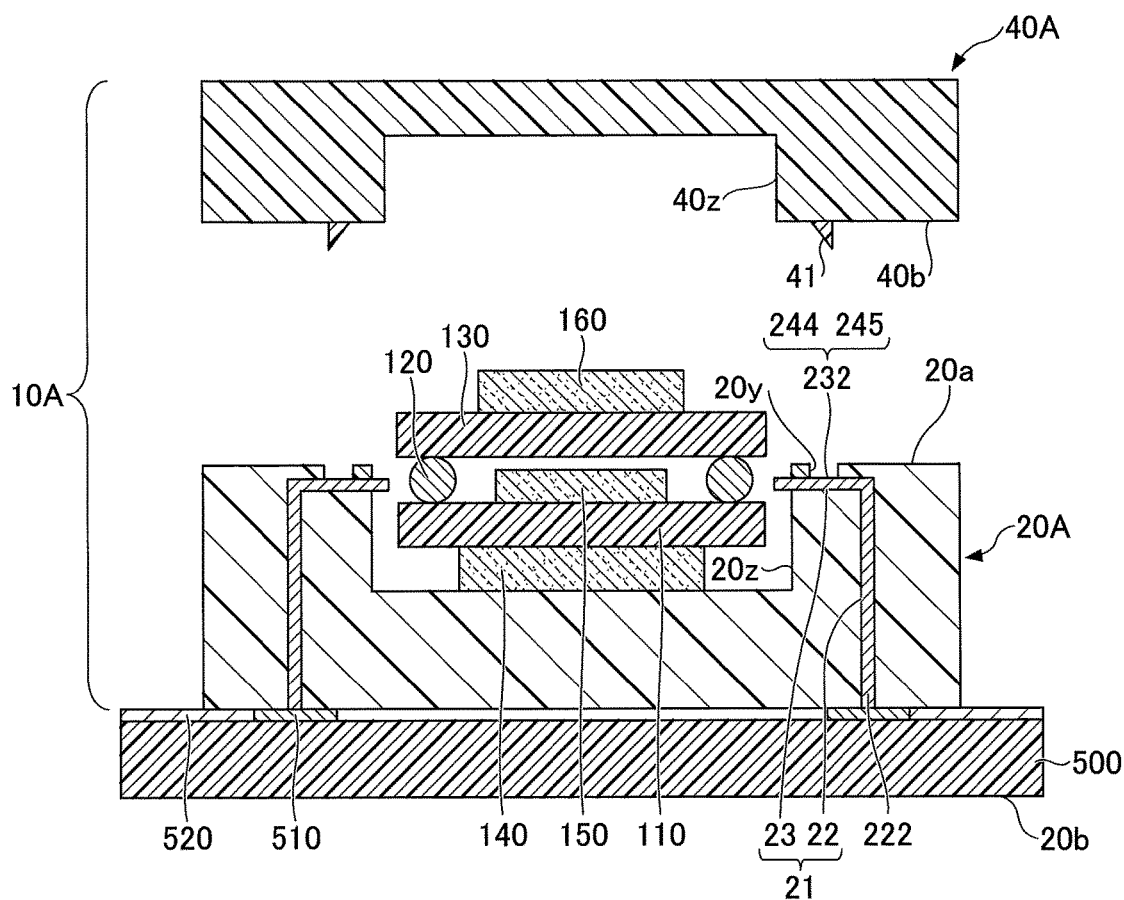
FIG. 7A and FIG. 7B are diagrams illustrating an example of a state in which the PCBA is accommodated in the socket in a second embodiment.
Figure 7B:
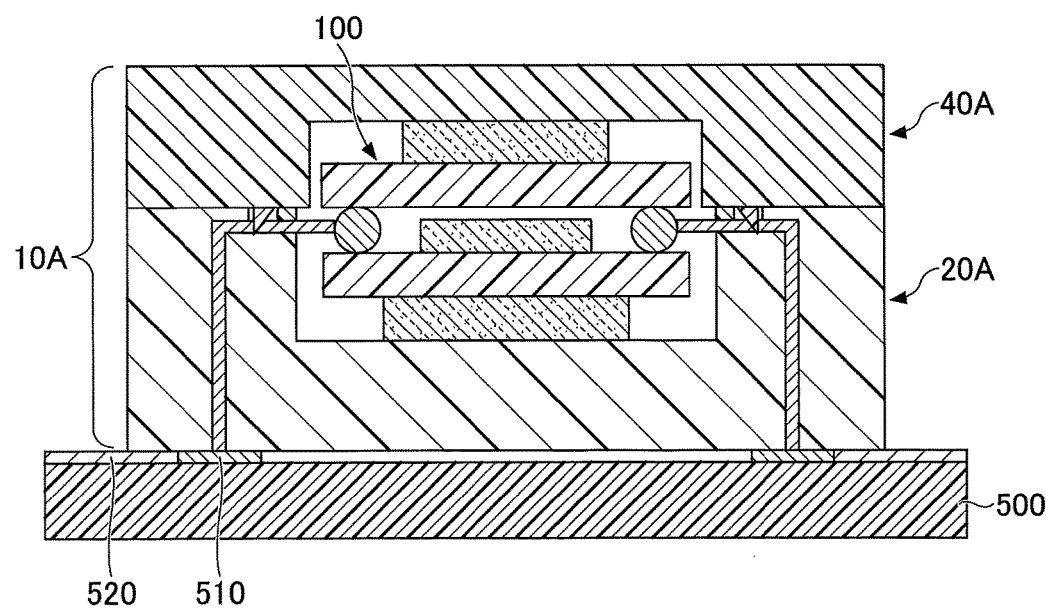

FIG. 7A and FIG. 7B are diagrams illustrating an example of a state in which the PCBA is accommodated in the socket in the second embodiment. FIG. 7A illustrates a state before a lid part 40A is arranged on a main body 20A, and FIG. 7B illustrates a state after the lid part 40A is arranged on the main body 20A.

As illustrated in FIG. 7A and FIG. 7B, a socket 10A in this second embodiment differs from the socket 10 in the first embodiment described above in conjunction with FIG. 2, for example, in that the main body 20 having the opening 20x is replaced by the main body 20A having a cavity 20z, no holding member 30 is provided, and the lid part 40 having the opening 40x is replaced by the lid part 40A having a cavity 40z. In the socket 10A, the PCBA 100 is held directly inside the cavity 20z of the main body 20A, without providing the holding member 30. For this reason, no stepped part 20c is provided in the main body 20A for receiving the holding member 30. The cavity 20z is an example of the accommodating part of the main body 20A accommodating the PCBA 100.

Accordingly, depending on the structure at the lower surface of the PCBA 100, it is unnecessary to use the holding member 30. However, in the case in which the holding member 30 is used, it is advantageous in that the PCBA 100 can be held stably without being dependent on the structure at the lower surface of the PCBA 100. In addition, unlike the lid part 40 having the opening 40x, the lid part 40A does not need to have an opening and may have the cavity 40z instead, for example.

According to each of the embodiments described above, it is possible to provide a socket that enables inspection of a PCBA without providing a special structure for enabling inspection, even in a case in which the PCBA has a structure such that probes cannot contact connection terminals provided on a lower surface of the PCBA, from under the lower surface of the PCBA.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A socket comprising:
a main body including one of a cavity and an opening configured to accommodate a printed circuit board assembly that is to be inspected, wherein the printed circuit board assembly includes a substrate mounted with an electronic component, and a plurality of connection terminals protruding from a surface of the substrate and respectively having a side surface exposed at an outer peripheral surface of the substrate, and wherein the plurality of connection terminals are positioned within the one of the cavity and the opening in a state in which the printed circuit board assembly is accommodated in the one of the cavity and the opening;
a plurality of probes respectively including a fixed part that is fixed to the main body, and a movable part that is movable with respect to the fixed part; and
a pressing part configured to press against the movable part,
wherein the movable part includes a tip end part that moves to a position contactable to the side surface of one of the plurality of connection terminals within the one of the cavity and the opening, when the pressing part presses against the movable part.
2. The socket as claimed in claim 1, further comprising:
a holding member, positioned by the main body, and configured to hold the printed circuit board assembly, wherein the holding member includes two L-shaped members, and
wherein an inner edge part of each of the two L-shaped members contacts an outer edge part of the surface of the substrate from which the plurality of connection terminals protrude, to hold the printed circuit board assembly on the holding member.
3. The socket as claimed in claim 1, wherein the movable part moves back and forth in a direction parallel to the surface of the substrate from which the plurality of connection terminals protrude, according to a pressing force of the pressing part that presses against the movable part.
4. The socket as claimed in claim 3, further comprising:
a lid part having a lower surface arranged on the main body, and configured to fix the printed circuit board assembly on the main body,
wherein the pressing part projects from the lower surface of the lid part in a direction toward the main body, and
wherein the movable part is pressed by the pressing part when the lid part is arranged on the main body, to move the tip end part of the movable part to the position contactable to the side surface of the one of the plurality of connection terminals within the one of the cavity and the opening.
5. The socket as claimed in claim 3, further comprising:
a holding member, positioned by the main body, and configured to hold the printed circuit board assembly, wherein the holding member includes two L-shaped members, and
wherein an inner edge part of each of the two L-shaped members contacts an outer edge part of the surface of the substrate from which the plurality of connection terminals protrude, to hold the printed circuit board assembly on the holding member.
6. The socket as claimed in claim 1, further comprising:
a lid part having a lower surface arranged on the main body, and configured to fix the printed circuit board assembly on the main body,
wherein the pressing part projects from the lower surface of the lid part in a direction toward the main body, and wherein the movable part is pressed by the pressing part when the lid part is arranged on the main body, to move the tip end part of the movable part to the position contactable to the side surface of the one of the plurality of connection terminals within the one of the cavity and the opening.

7. The socket as claimed in claim 6, wherein
the movable part includes a tapered part having a diameter that increases toward the one of the cavity and the opening,
the pressing part includes a sloping part configured to contact the tapered part, and
the tapered part is pressed by the sloping part when the lid part is arranged on the main body, to move the tip end part of the movable part to the position contactable to the side surface of the one of the plurality of connection terminals within the one of the cavity and the opening.

8. The socket as claimed in claim 7, further comprising:
a holding member, positioned by the main body, and configured to hold the printed circuit board assembly,
wherein the holding member includes two L-shaped members, and
wherein an inner edge part of each of the two L-shaped members contacts an outer edge part of the surface of the substrate from which the plurality of connection terminals protrude, to hold the printed circuit board assembly on the holding member.

9. The socket as claimed in claim 7, wherein
the movable part includes a tubular part connected to a large-diameter part of the tapered part, and an urging member,
one end of the tip end part enters inside the tubular part, from the one of the cavity and the opening, and
the urging member is provided between the one end of the tip end part and the large-diameter part of the tapered part, and is configured to urge the tip end part toward the one of the plurality of connection terminals.

10. The socket as claimed in claim 9, further comprising:
a holding member, positioned by the main body, and configured to hold the printed circuit board assembly,
wherein the holding member includes two L-shaped members, and
wherein an inner edge part of each of the two L-shaped members contacts an outer edge part of the surface of the substrate from which the plurality of connection terminals protrude, to hold the printed circuit board assembly on the holding member.

* * * * *